US010734462B2

(12) United States Patent
Nishinohara

(10) Patent No.: US 10,734,462 B2
(45) Date of Patent: *Aug. 4, 2020

(54) FLEXIBLE DISPLAY DEVICE INCLUDING BENT FLEXIBLE SUBSTRATE AND BENT CIRCUIT LAYER

(71) Applicant: Japan Display Inc., Minato-ku (JP)

(72) Inventor: Takuma Nishinohara, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/374,048

(22) Filed: Apr. 3, 2019

(65) Prior Publication Data

US 2019/0229171 A1     Jul. 25, 2019

Related U.S. Application Data

(63) Continuation of application No. 15/347,030, filed on Nov. 9, 2016, now Pat. No. 10,319,799.

(30) Foreign Application Priority Data

Nov. 20, 2015  (JP) ................................ 2015-227559

(51) Int. Cl.
    *H01L 27/32*          (2006.01)
    *H01L 51/52*          (2006.01)
    *H01L 51/00*          (2006.01)

(52) U.S. Cl.
    CPC ...... *H01L 27/3262* (2013.01); *H01L 27/3276* (2013.01); *H01L 51/0097* (2013.01);
(Continued)

(58) Field of Classification Search
CPC ............. H01L 27/3262; H01L 27/3276; H01L 51/0097; H01L 51/524; H01L 51/5256
See application file for complete search history.

(56) References Cited

U.S. PATENT DOCUMENTS 10,319,799 B2 *    6/2019    Nishinohara ....... H01L 27/3262
2011/0260180 A1    10/2011    Kuranaga et al.
(Continued)

FOREIGN PATENT DOCUMENTS

CN         104103669 A     10/2014
JP          2011-227369      11/2011
(Continued)

OTHER PUBLICATIONS

Combined Chinese Office Action and Search Report dated Aug. 28, 2018 in corresponding Patent Application No. 201611010959.9 (with English Translation and English Translation of Category of Cited Documents) citing document AO therein, 13 pages.

(Continued)

*Primary Examiner* — Matthew E. Gordon
(74) *Attorney, Agent, or Firm* — Oblon, McClelland, Maier & Neustadt, L.L.P.

(57) ABSTRACT

A display device includes a substrate that is formed of a plurality of layers stacked together and a circuit layer. A circuit layer includes a display element area in which a plurality of pixel electrodes corresponding to a plurality of unit pixels and a self-luminous element layer are provided, and a peripheral area that has a wiring to the display element area and a terminal and is at least partially bent. The substrate includes a first area that overlaps the display element area of the circuit layer and a second area that overlaps the peripheral area and is at least partially bent. The layers include at least one inorganic layer and a plurality of organic layers. The number of the organic layers in the first area is greater than the number of the organic layers in the second area.

3 Claims, 10 Drawing Sheets

(52) U.S. Cl.
CPC ........ *H01L 51/524* (2013.01); *H01L 51/5256* (2013.01); *H01L 2251/5338* (2013.01); *Y02E 10/549* (2013.01); *Y02P 70/521* (2015.11)

(56) References Cited

U.S. PATENT DOCUMENTS

| | | |
|---|---|---|
| 2013/0181204 A1 | 7/2013 | Kuranaga et al. |
| 2014/0239276 A1* | 8/2014 | Lin .................. H01L 27/3244 |
| | | 257/40 |
| 2014/0306260 A1 | 10/2014 | Yamazaki |
| 2016/0035759 A1 | 2/2016 | Kwon |

FOREIGN PATENT DOCUMENTS

| | | |
|---|---|---|
| TW | 201440582 A | 10/2014 |
| TW | 201521261 A | 6/2015 |

OTHER PUBLICATIONS

Office Action dated Jun. 21, 2017 in Taiwanese Patent Application No. 105137562 (with English translation).

\* cited by examiner

FLEXIBLE DISPLAY DEVICE INCLUDING BENT FLEXIBLE SUBSTRATE AND BENT CIRCUIT LAYER

CROSS-REFERENCE TO RELATED APPLICATION

The present application is a continuation of U.S. application Ser. No. 15/347,030, filed Nov. 9, 2016, which claims priority from Japanese application JP2015-227559 filed on Nov. 20, 2015, the content of which is hereby incorporated by reference into this application.

BACKGROUND OF THE INVENTION

1. Field of the Invention

The present invention relates to a display device.

2. Description of the Related Art

In recent years, flexible display devices have been developed. For example, such a display device includes a flexible resin substrate on which a circuit layer and an organic electroluminescence layer are formed (JP2011-227369A). The flexible substrate has been manufactured by forming an organic layer on a glass substrate and hardening the organic layer to be removed from the glass substrate.

The organic layer is irradiated with a laser beam when being removed from the glass substrate. As such, if the thickness of the organic layer is thin, deformation of the organic layer is large at the laser-irradiated area, and large stress is applied to the boundary between the irradiated area and the non-irradiated area. This causes the organic electroluminescence layer on the boundary to flake off. For this reason, an organic layer needs to have a thickness in a certain extent. However, the thickness of the organic layer is the most dominant parameter particularly for bending resistance of a terminal part, and the bending resistance is reduced as the thickness of the layer is larger.

SUMMARY OF THE INVENTION

One or more embodiments of the present invention have been conceived in view of the above, and an object thereof is to increase bending resistance of an organic layer while preventing delamination of a self-luminous element layer on an organic layer.

A display device according to the present invention includes a substrate that is formed of a plurality of layers stacked together, a circuit layer that is stacked on the substrate so as to include a circuit of a plurality of unit pixels forming an image, and a sealing layer that covers and seals the circuit layer, wherein the circuit layer includes a display element area in which a plurality of pixel electrodes corresponding to the unit pixels and a self-luminous element layer are provided, and a peripheral area that has a wiring to the display element area and a terminal and is at least partially bent, the substrate includes a first area that overlaps the display element area of the circuit layer and a second area that overlaps the peripheral area and is at least partially bent, the plurality of layers include at least one inorganic layer and a plurality of organic layers, and a number of the organic layers in the first area is greater than a number of the organic layers in the second area.

According to the present invention, the number of the organic layers is larger in the first area that overlaps the display element area, and thus the self-luminous element layer can be prevented from being delaminated. The number of the organic layers is smaller in the second area, and thus bending resistance of the substrate can be improved.

BRIEF DESCRIPTION OF THE DRAWINGS

In the accompanying drawings:

FIG. 3 FIG. 1 is across-sectional view of the display device shown in FIG. 1 taken along the line III-III;

DETAILED DESCRIPTION OF THE INVENTION

An embodiment of the present invention will be described below in detail with reference to the accompanying drawings.

First Embodiment

Figure 1:
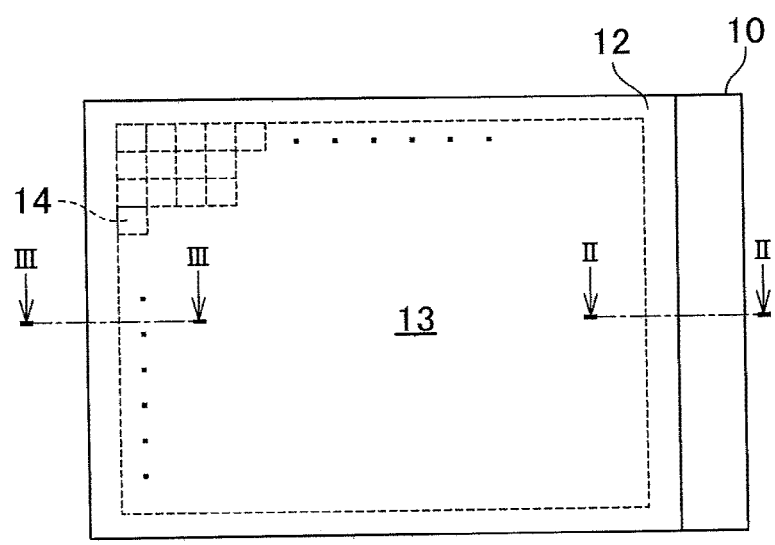
FIG. 1 is a schematic view of a display device according to first embodiment of the present invention.

FIG. 1 is a schematic view of a display device according to the first embodiment of the present invention. An organic electroluminescence display device is taken as an example of a display device. The display device has a substrate 10 and a counter substrate 12. A plurality of unit pixels 14 respectively emit light, thereby displaying an image on a display area 13 of the counter substrate 12.

Figure 2:
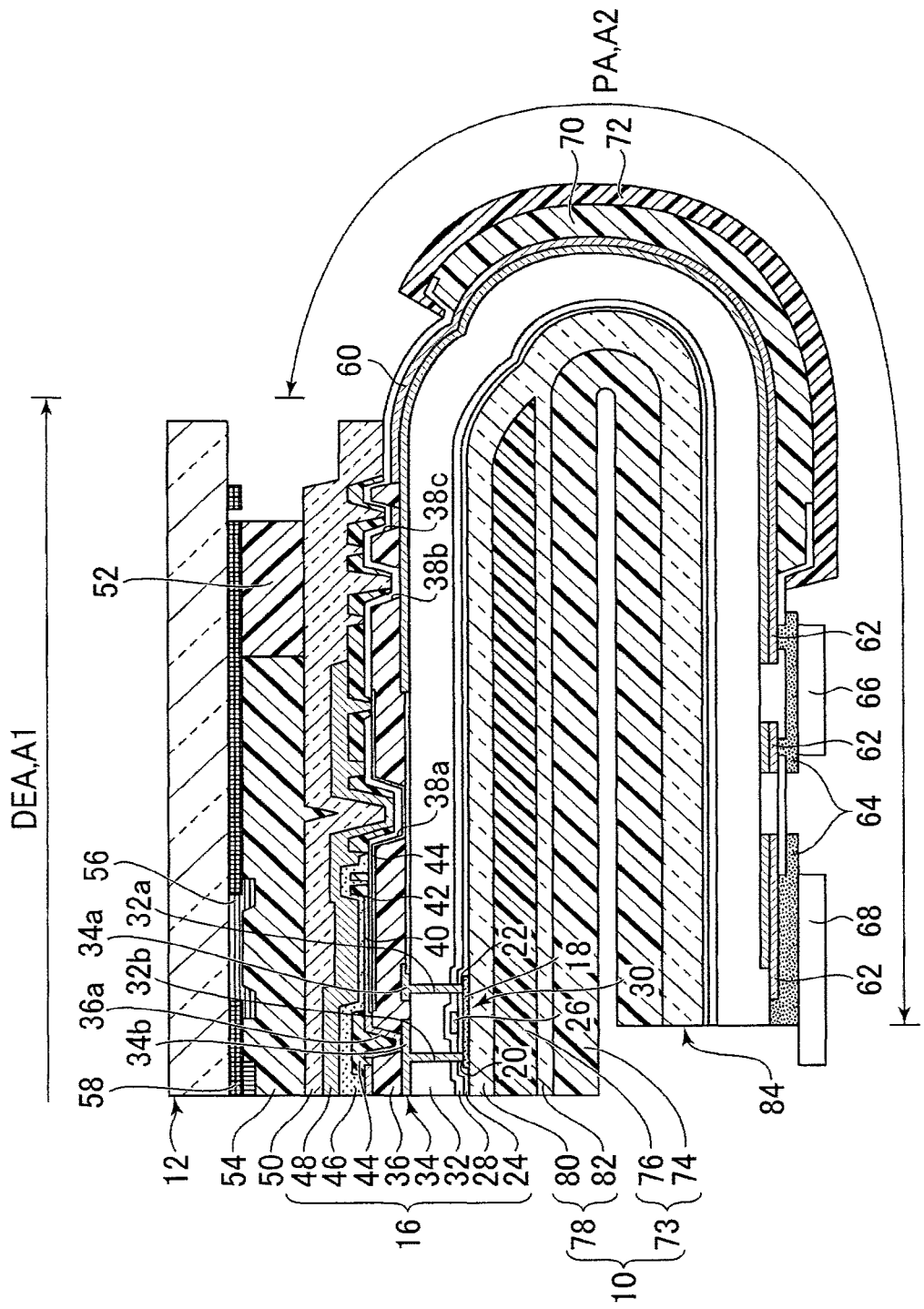
FIG. 2 is a cross-sectional view of the display device shown in FIG. 1 taken along the line II-II.
Figure 3:
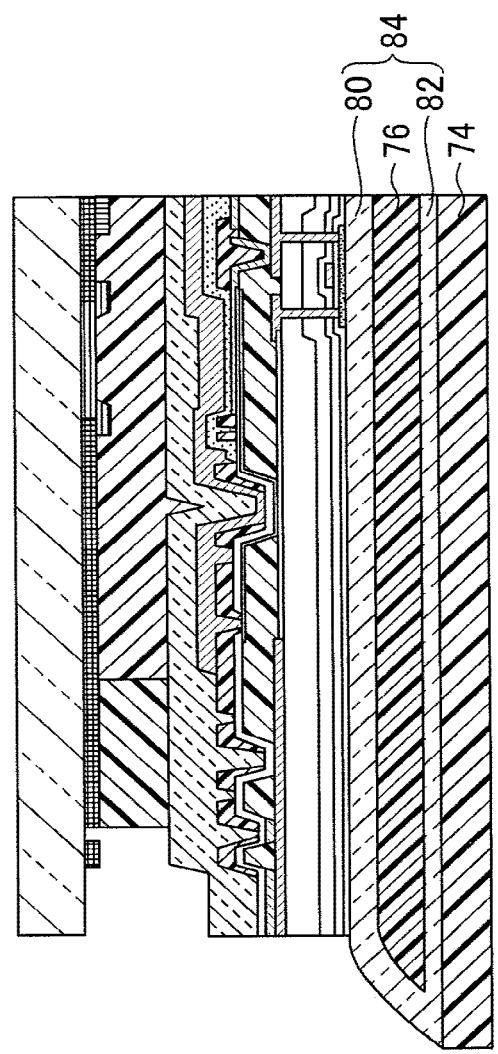

FIG. 2 is a cross-sectional view of the display device shown in FIG. 1 taken along the line II-II. FIG. 3 is a cross-sectional view of the display device shown in FIG. 1 taken along the line III-III. A circuit layer 16 is provided on the substrate 10. The circuit layer 16 includes circuits that respectively correspond to the unit pixels 14 constituting the image and control a current. The circuit layer 16 includes a display element area DEA on which elements for displaying an image are disposed.

In the display element area, a semiconductor layer 18 is formed on the substrate 10. A source electrode 20 and a drain electrode 22 are provided on the semiconductor layer 18. A gate insulating film 24 is formed so as to cover the semiconductor layer 18, and a gate electrode 26 is formed on the gate insulating film 24. An insulating interlayer 28 is formed so as to cover the gate electrode 26. The source electrode 20 and the drain electrode 22 pass through the gate insulating film 24 and the insulating interlayer 28. The thin film transistor 30 is composed of the semiconductor layer 18, the source electrode 20, the drain electrode 22, and the gate electrode 26. A passivation layer 32 is provided so as to cover the thin film transistor 30.

A conductive layer 34 is formed on the passivation layer 32. A first part 34a of the conductive layer 34 is a power source line and electrically connected to one of the source electrode 20 and the drain electrode 22 via a contact hole 32a penetrating the passivation layer 32. The other one of the source electrode 20 and the drain electrode 22 is electrically connected to a second part 34b of the conductive layer 34 via a contact hole 32b penetrating the passivation layer 32.

A flattening layer 36 is disposed on the conductive layer 34. On the flattening layer 36, separation grooves 38a, 38b, and 38c are formed to surround the display area 13 shown in FIG. 1 in order to prevent moisture ingress.

A plurality of pixel electrodes 40 are provided on the flattening layer 36 so as to respectively correspond to the unit pixels 14 shown in FIG. 1. The pixel electrode 40 includes a lower layer that reflects light and an upper layer that transmits light, which are not illustrated. The pixel electrode 40 is electrically connected to the second part 34b of the conductive layer 34 via the contact hole 36a penetrating the flattening layer 36. A capacitive electrode 44 is provided below the pixel electrode 40 through the insulating film 42 between them, and a capacitance is formed between the pixel electrode 40 and the capacitive electrode 44.

An insulating layer 44 is formed on the passivation layer 32 and the pixel electrode 40. The insulating layer 44 is disposed on a perimeter of the pixel electrode 40, and formed so as to make an opening on a part (e.g., the center) of the pixel electrode 40. The insulating layer 44 forms a bank that surrounds a part of the pixel electrode 40.

A self-luminous element layer 46 is disposed on the pixel electrode 40. The self-luminous element layer 46 is continuously disposed across the plurality of pixel electrodes 40, and also disposed on the insulating layer 44. As a variation, a self-luminous element layer 46 may be separately provided to each pixel electrode 40. The self-luminous element layer 46 includes at least a light emitting layer, and may further include at least one of an electron transport layer, a hole transport layer, an electron injection layer, and a hole injection layer.

A common electrode 48 (e.g., cathode) is provided on the self-luminous element layer 46. The common electrode 48 is formed so as to be disposed on the insulating layer 44, which is a bank. The self-luminous element layer 46 is disposed between the pixel electrode 40 and the common electrode 48, and emits light by being controlled in brightness by an electric current that flows between the pixel electrode 40 and the common electrode 48.

The circuit layer 16 is sealed by the sealing layer 50 and thus protected from moisture. The sealing layer 50 is a lamination of inorganic films composed of silicon nitride and silicon dioxide, and organic films composed of acrylic resin, for example. A counter substrate 12 is provided on the sealing layer 50 via a sealing material 52 and a filler layer 54. The counter substrate 12 has colored layers 56 including a plurality of colors (e.g., blue, red, and green), and a black matrix 58 is formed of metal or resin between two adjacent colored layers 52 in different colors, and serves as a color filter. The counter substrate 12 may be a touch panel, or include a polarizing plate or a retardation plate.

The circuit layer 16 includes a peripheral area PA extending from the display element area DEA. A wiring 60 and terminals 62 are provided in the peripheral area PA. The wiring 60 and the terminals 62 include a part of the conductive layer 34 formed on the passivation layer 32. The wiring 60 is provided so as to extend to the display element area DEA. The terminals 62 are electrically connected to an integrated circuit chip 66 and a flexible substrate 68 via an anisotropic conductive film 64. A first protective layer 70 and a second protective layer 72, each composed of one or more layers, are stacked on the wiring 60. The first protective layer 70 is formed of the same material and through the same process as the flattening layer 36. The second protective layer 72 is formed of the same material and through the same process as the insulating layer 44 for forming the bank. The peripheral area PA of the circuit layer 16 is at least partially bent, and in response to this, the wiring 60 is also bent. On the other hand, the display element area DEA is not bent and flat.

The circuit layer 16 is stacked on the substrate 10. The substrate 10 includes a first area A1 that overlaps the display element area DEA of the circuit layer 16. The first area A1 corresponds to the display element area DEA, and is flat and not bent. The substrate 10 includes a second area A2 that overlaps the peripheral area PA of the circuit layer 16. The second area A2 is located outside the sealing material 52, and at least partially bent. The wiring 60 is bent at the peripheral area PA of the circuit layer 16 so as to overlap the bent second area A2. The wiring 60 is located between the underlying substrate 10 and the overlying first protective layer 70 and second protective layer 72. As such, the wiring 60 is located at the midway in the direction of the thickness of the stack structure, and thus reduces a displacement of expansion and contraction due to bending. This enables to prevent the wiring 60 from being disconnected.

The substrate 10 is composed of multiple layers stacked on top of each other. The multiple layers of the substrate 10 include multiple organic layers 73. The multiple organic layers 73 include at least one whole organic layer 74 that extends throughout the first area A1 and the second area A2. The whole organic layer 74 has a thickness (e.g., 5 to 10 μm) with self-supporting ability as a base material. This thickness is a thickness required to resist delamination when the layer is formed on a glass substrate (not shown) and delaminated in the manufacturing process.

The multiple organic layers 73 include at least one partial organic layer 76. The partial organic layer 76 is disposed on the circuit layer 16 side in the both sides of the whole organic layer 74. The at least one partial organic layer 76 is stacked on the whole organic layer 74 in the first area A1 so as to avoid the second area A2 that is bent. The partial organic layer 76 has the thickness of, for example, 5 μm or more. The total thickness of the whole organic layer 74 and the partial organic layer 76 is from 10 to 15 μm or more. This thickness is a thickness required to prevent expansion due to heat of a laser beam irradiated when the layer is delaminated from the glass substrate in the manufacturing process, and prevent the overlying self-luminous element layer 46 from being delaminated.

The multiple layers composing the substrate 10 include at least one inorganic layer 78. The thickness of the at least one inorganic layer 78 is also added to the thickness of the substrate 10 to enhance the self-supporting ability as a base material. The at least one inorganic layer 78 serves as a barrier film for blocking moisture, and also prevents the self-luminous element layer 46 from being delaminated with the added thickness.

The at least one inorganic layer 78 includes a first inorganic layer 80 between the multiple organic layers 73 (whole organic layer 74 and partial organic layer 76) and the circuit layer 16. The at least one inorganic layer 78 includes a second inorganic layer 82 between the at least one whole organic layer 74 and the at least one partial organic layer 76. The partial organic layer 76 is disposed between the first inorganic layer 80 and the second inorganic layer 82.

The first inorganic layer 80 and the second inorganic layer 82 are in contact with each other and integrated outside of the first area A1 (outside of sealing material 52) and extends to the second area A2 so as to constitute a third inorganic layer 84 that extends throughout the first area A1 and the second area A2. The third inorganic layer 84 is bent at the second area A2 and flat at the first area A1.

As shown in FIG. 2 and FIG. 3, the first inorganic layer 80 and the second inorganic layer 82 are in contact with each other and integrated around the partial organic layer 76, and seal the partial organic layer 76. As such, the first inorganic layer 80 and the second inorganic layer 82 have water barrier property, and thus the partial organic layer 76 can be protected from moisture.

According to this embodiment, the number of layers (two layers composed of the whole organic layer 74 and the partial organic layer 76) that the multiple layers of organic layers 73 has in the first area A1 is greater than the number of layers (one layer composed of the whole organic layer 74) that the multiple organic layers 73 have in the second area A2. The substrate 10 has a large thickness at the first area A1 where the substrate 10 overlaps the display element area DEA because the number of the organic layers 73 is greater, and thus can prevent the self-luminous element layer 46 from being delaminated. In the second area A2 where the substrate 10 is at least partially bent, the thickness of the substrate 10 is small because the number of the organic layers 73 is smaller, and thus the bending resistance of the substrate 10 can be improved.

Second Embodiment

Figure 4:
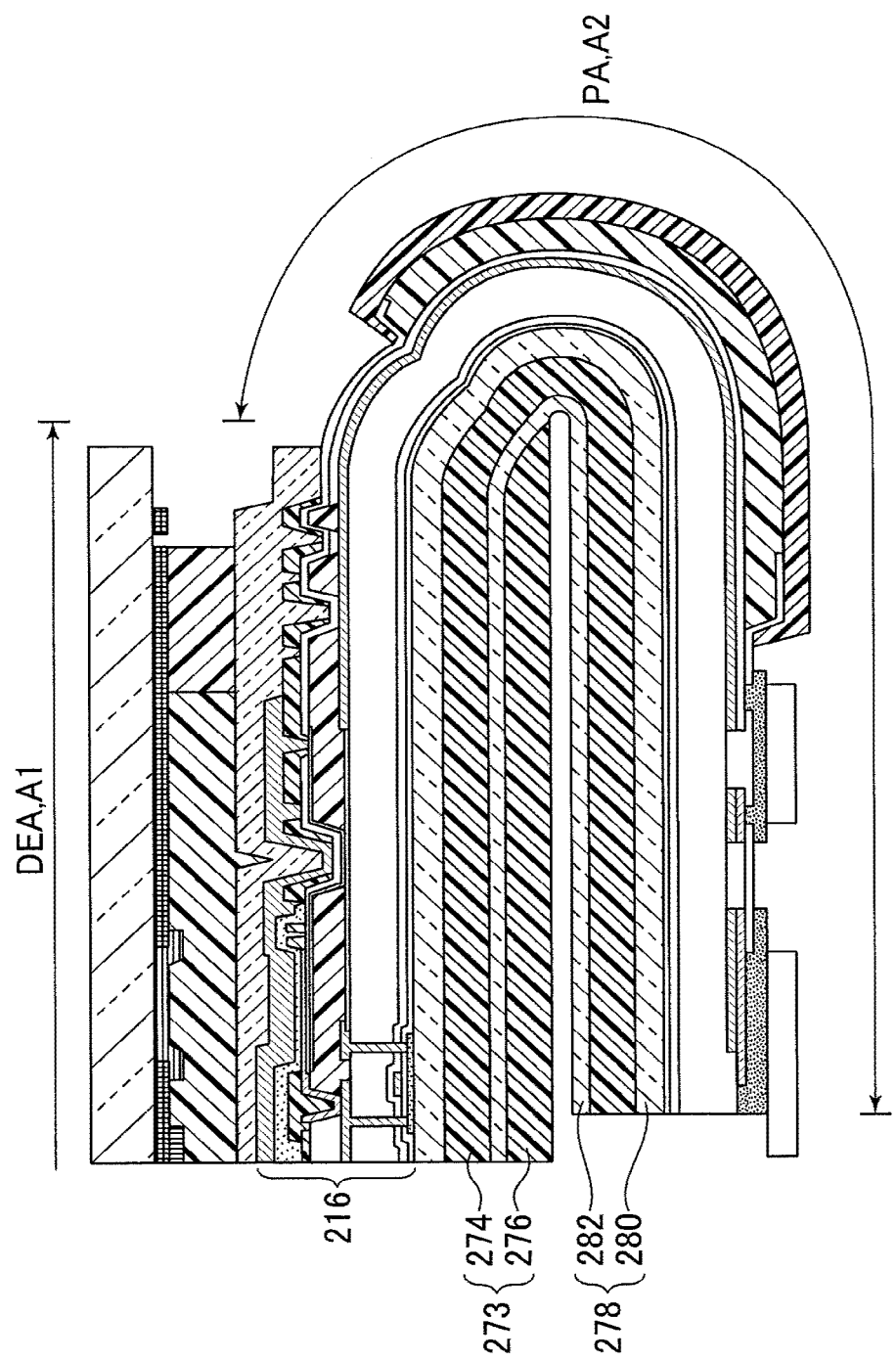
FIG. 4 is a schematic cross-sectional view of the display device according to second embodiment of the present invention.

FIG. 4 is a schematic cross-sectional view of the display device according to second embodiment of the present invention. This embodiment is different from the first embodiment in that the partial organic layer 276 is disposed on one of the sides of the whole organic layer 274 that is opposite to the circuit layer 216 side.

The at least one inorganic layer 278 includes the first inorganic layer 280 between the multiple organic layers 273 and the circuit layer 216. The first inorganic layer 280 extends throughout the first area A1 and the second area A2. The at least one inorganic layer 278 includes the second inorganic layer 282 between the at least one whole organic layer 274 and the at least one partial organic layer 276. The second inorganic layer 282 extends throughout the first area A1 and the second area A2. A part of the second inorganic layer 282 (a part positioned in the first area A1) is positioned in the circuit layer 216 side of the both sides of the partial organic layer 276 or in one of the both sides of the whole organic layer 274 that is opposite to the circuit layer 216 side. At least part of the second inorganic layer 282 (a part positioned in the second area A2) is positioned in one of the both sides of the multiple organic layers 273 that is opposite to the circuit layer 216 side. The lower surfaces of the second inorganic layer 282 and the partial organic layer 276 are flush with each other. In the manufacturing process, this configuration is achieved by forming the partial organic layer 276 on a glass substrate (not shown) and forming the second inorganic layer 282 so as to be disposed on the glass substrate in or around the partial organic layer 276.

According to this embodiment, the partial organic layer 276 is disposed in one of the both sides of the second inorganic layer 282 that is opposite to the circuit layer 216 side, where the second inorganic layer 282 extends throughout the first area A1 and the second area A2. As such, the partial organic layer 276 is separated from the circuit layer 216 by the second inorganic layer 282, which prevents moisture ingress.

Third Embodiment

Figure 5:
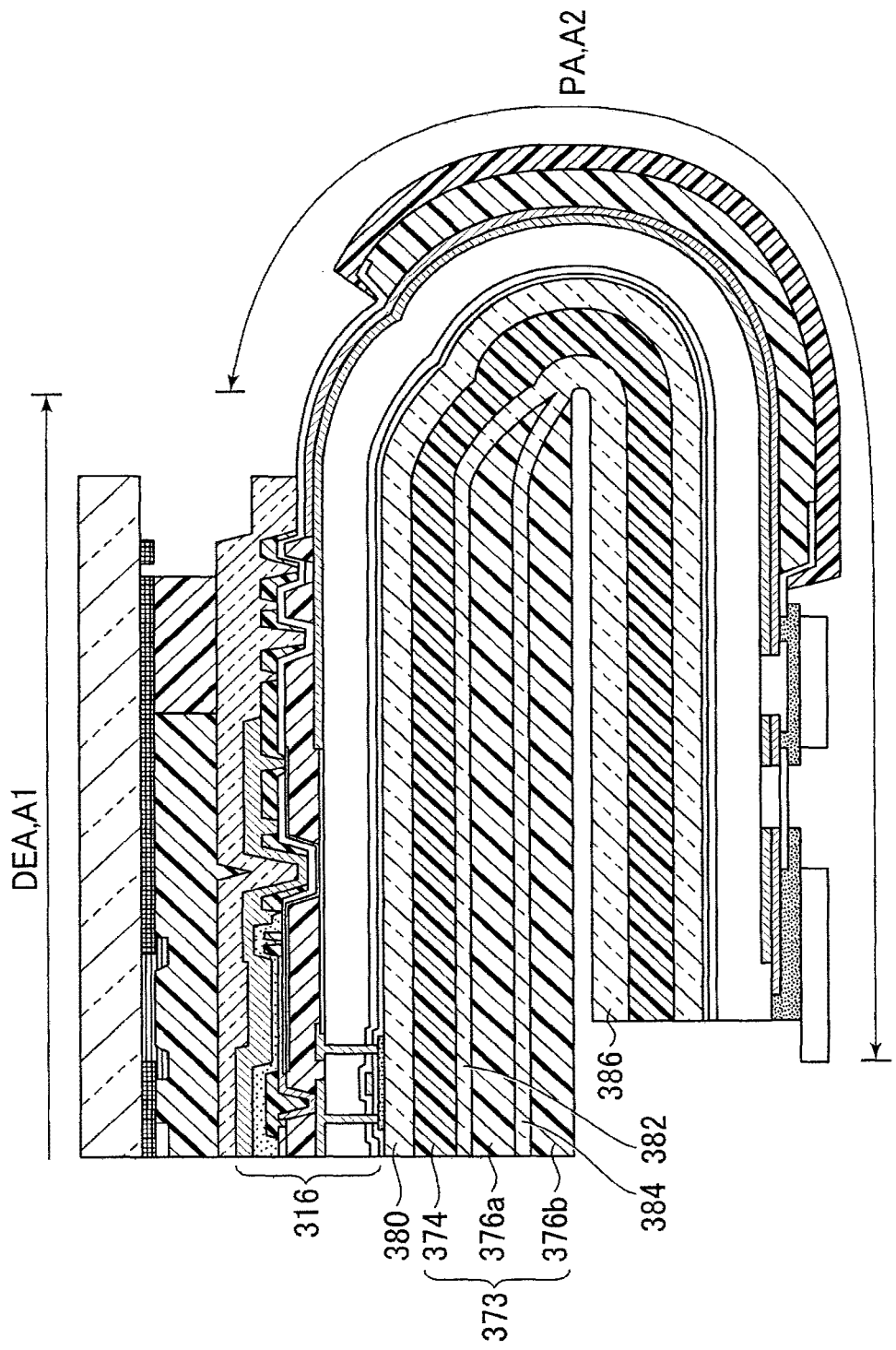
FIG. 5 is a schematic cross-sectional view of the display device according to third embodiment of the present invention.

FIG. 5 is a schematic cross-sectional view of the display device according to third embodiment of the present invention. This embodiment is different from the second embodiment in that multiple partial organic layers 376a and 376b are provided.

The first inorganic layer 380 is disposed between the organic layers 373 and the circuit layer 316 and extends throughout the first area A1 and the second area A2. The second inorganic layer 382 is disposed between the whole organic layer 374 and the partial organic layer 376a, and the third inorganic layer 384 is disposed between the partial organic layers 376a and 376b. The second inorganic layer 382 and the third inorganic layer 384 are in contact with each other and integrated in the outside of the first area A1 (outside of the sealing material 52), and extend to the second area A2 to constitute a fourth inorganic layer 386 extending throughout the first area A1 and the second area A2. At least a part of the fourth inorganic layer 386 (a part positioned in the second area A2) is positioned on the side of the multiple organic layers 373 that is opposite to the circuit layer 316 side. The fourth inorganic layer 386 is bent at the second area A2 and flat at the first area A1. The lower surfaces of the fourth inorganic layer 386 and the partial organic layer 376b are flush with each other.

The second inorganic layer 382 and the third inorganic layer 384 are in contact with each other and integrated around the partial organic layer 376a, and seal the partial organic layer 376a. As such, the second inorganic layer 382 and the third inorganic layer 384 have water barrier property, and thus the partial organic layer 376a can be protected from moisture.

Fourth Embodiment

Figure 6:
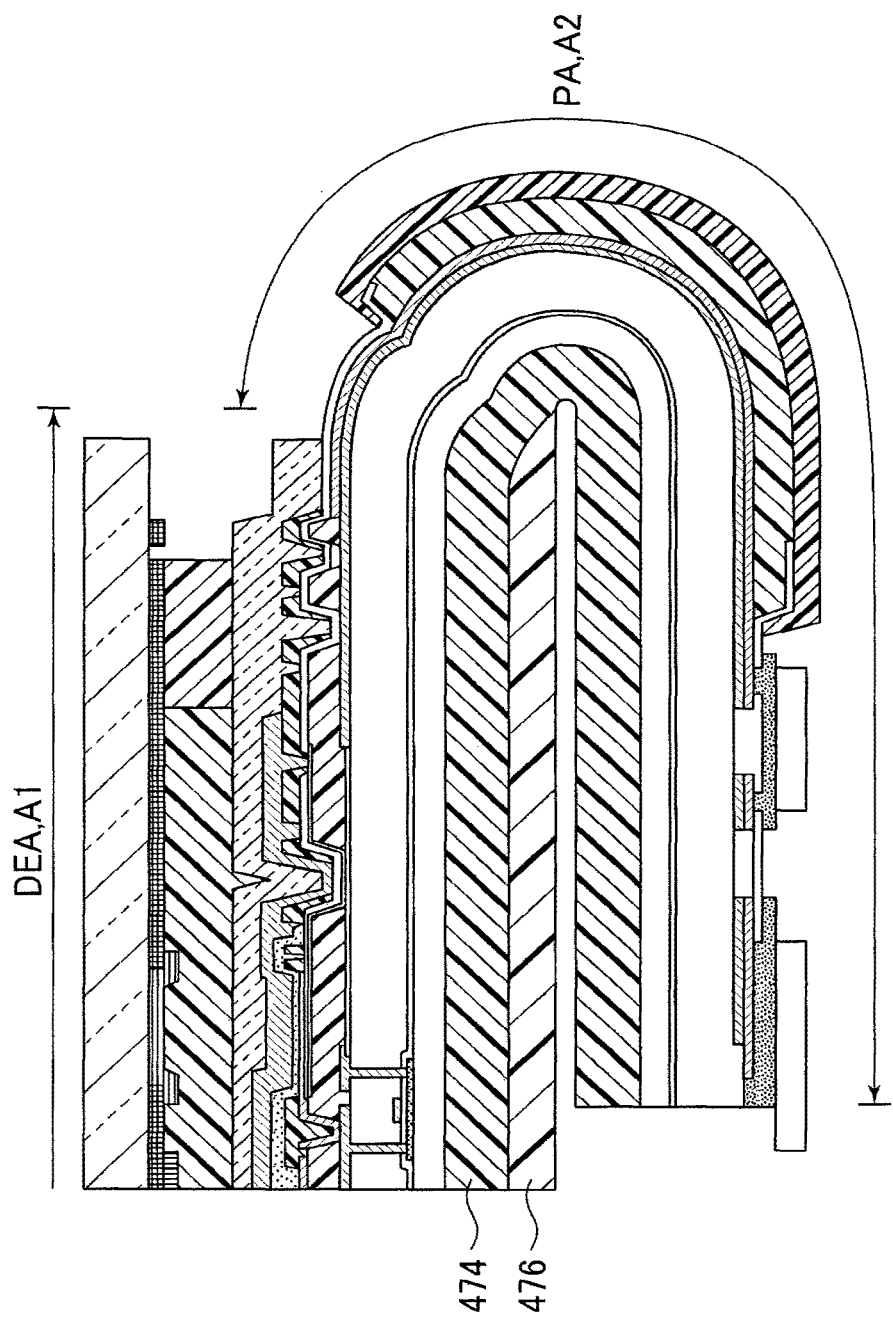
FIG. 6 is a schematic cross-sectional view of the display device according to fourth embodiment of the present invention.

FIG. 6 is a schematic cross-sectional view of the display device according to fourth embodiment of the present invention. This embodiment is different from the second embodiment in not having a second inorganic layer 282 shown in FIG. 4. The whole organic layer 474 and the partial organic layer 476 are in contact with each other and stacked together. The lower surfaces of the whole organic layer 474 and the partial organic layer 476 are flush with each other.

Fifth Embodiment

Figure 7:
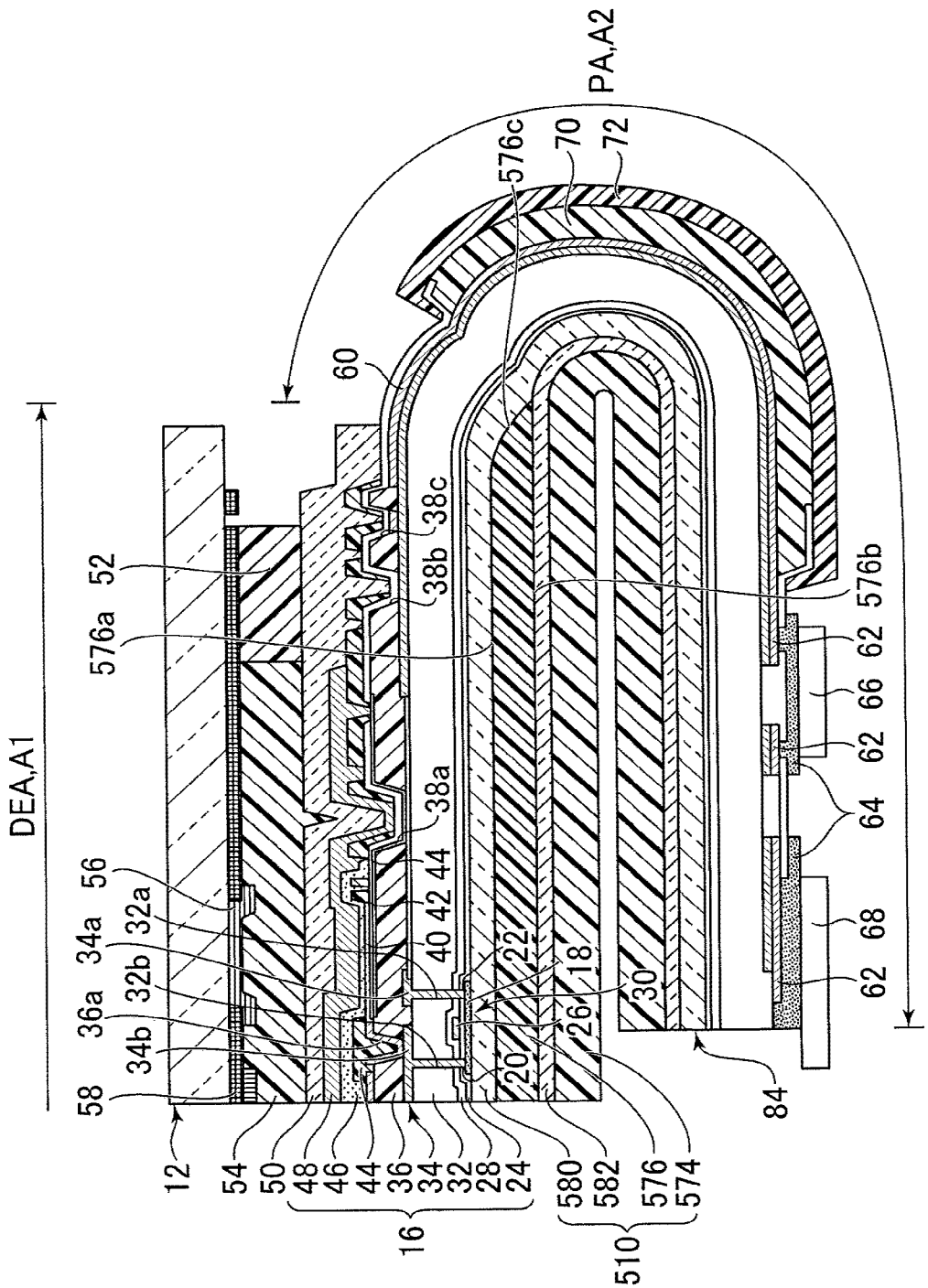
FIG. 7 is a schematic cross-sectional view of the display device according to fifth embodiment of the present invention.

FIG. 7 is a schematic cross-sectional view of the display device according to fifth embodiment of the present invention. In this embodiment, the substrate 510 includes a first organic layer 574, a first inorganic layer 582 formed on the first organic layer 574, a second organic layer 576 formed on the first inorganic layer 582, and a second inorganic layer 580 formed on the second organic layer 576. The first organic layer 574, the first inorganic layer 582, the second organic layer 576, and the second inorganic layer 580 are disposed in the first area A1. The first organic layer 574, the first inorganic layer 582, and the second inorganic layer 580 are disposed in the second area A2.

The first inorganic layer 582 and the second inorganic layer 580 are in contact with each other in the second area A2. The first inorganic layer 582 and the second inorganic layer 580 are in contact with each other around the first area A1. In this manner, a first surface 576a of the second organic layer 576 on the circuit layer 16 side, a second surface 576b on the side opposite to the first surface 576a, and a side surface 576c are surrounded by inorganic material. Other descriptions are the same as those of the first embodiment.

Sixth Embodiment

Figure 8:
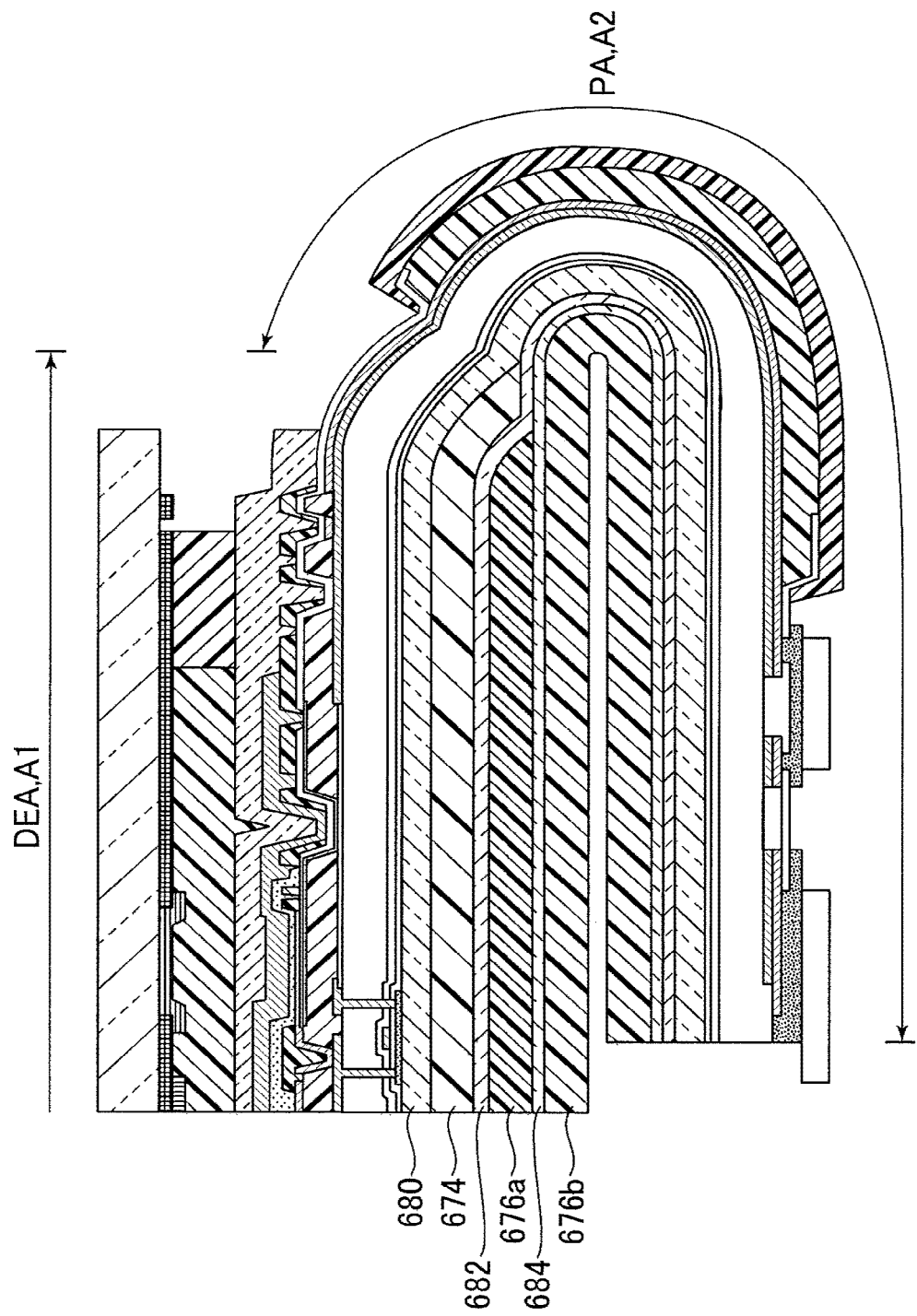
FIG. 8 is a schematic cross-sectional view of the display device according to sixth embodiment of the present invention.

FIG. 8 is a schematic cross-sectional view of the display device according to sixth embodiment of the present invention. In this embodiment, the organic layer 674 is provided in the first area A1 so as to avoid the second area A2. The inorganic layers 680 and 682, respectively disposed on and below the organic layer 674, are in contact with each other around the organic layer 674 so as to seal the organic layer 674. This enables the organic layer 674 closest to the circuit layer 16 to be effectively protected from moisture. Further, another organic layer 676a below the organic layer 674 is also sealed by the inorganic layers 682 and 684, respectively disposed on and below the organic layer 676a, and thus protected from moisture. This embodiment is different from the third embodiment shown in FIG. 5 in that the organic layer 676b farthest from the circuit layer 16 extends throughout the first area A1 and the second area A2.

Seventh Embodiment

Figure 9:
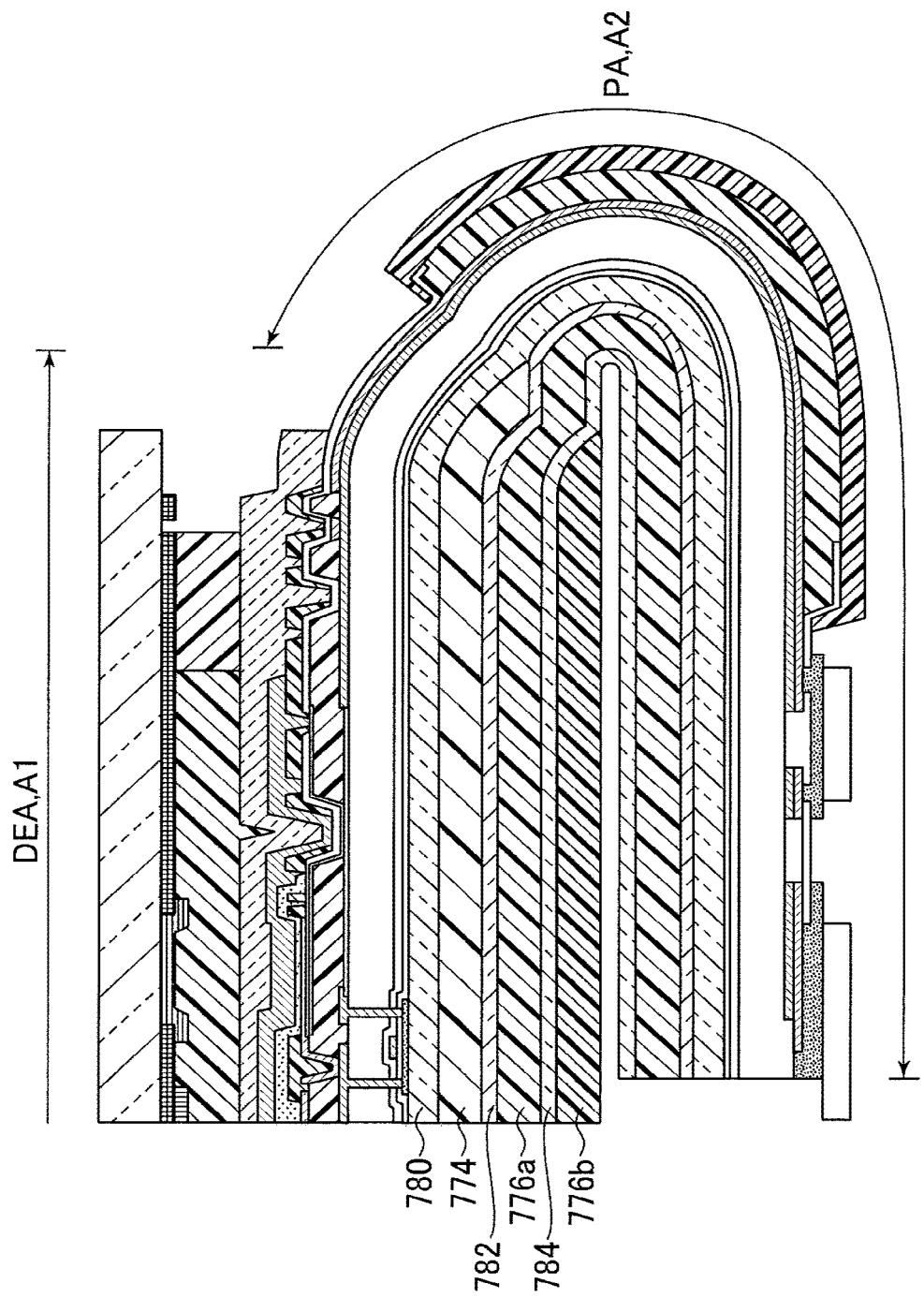
FIG. 9 is a schematic cross-sectional view of the display device according to seventh embodiment of the present invention.

FIG. 9 is a schematic cross-sectional view of the display device according to seventh embodiment of the present invention. In this embodiment, the organic layer 774 is provided in the first area A1 so as to avoid the second area A2. The inorganic layers 780 and 782, respectively disposed on and below the organic layer 774, are in contact with each other around the organic layer 774 to seal the organic layer 774. This enables the organic layer 774 closest to the circuit layer 16 to be effectively protected from moisture. This embodiment is different from the third embodiment shown in FIG. 5 in that another organic layer 776a below the organic layer 774 extends throughout the first area A1 and the second area A2. The organic layer 776b below the inorganic layer 784 and farthest from the circuit layer 16 is provided in the first area A1 so as to avoid the second area A2.

Eighth Embodiment

Figure 10:
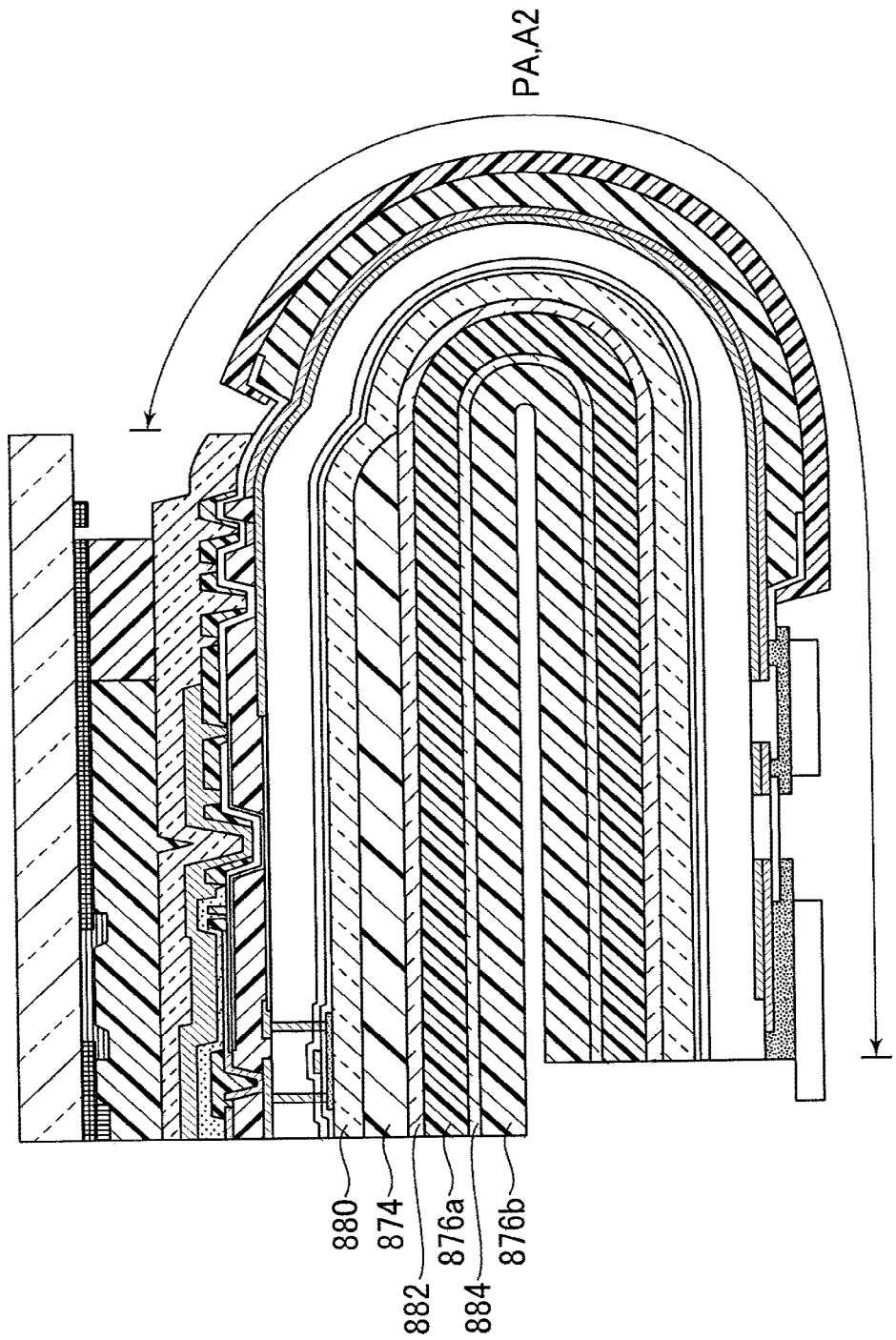
FIG. 10 is a schematic cross-sectional view of the display device according to eighth embodiment of the present invention.

FIG. 10 is a schematic cross-sectional view of the display device according to eighth embodiment of the present invention. In this embodiment, the organic layer 874 is provided in the first area A1 so as to avoid the second area A2. The inorganic layers 880 and 882, respectively disposed on and below the organic layer 874, are in contact with each other around the organic layer 874 to seal the organic layer 874. This enables the organic layer 874 closest to the circuit layer 16 to be effectively protected from moisture. This embodiment is different from the third embodiment shown in FIG. 5 in that the organic layers 876a and 876b that are below the inorganic layer 882 and away from the circuit layer 16 further than the organic layer 874 extend throughout the first area A1 and the second area A2.

The display device is not limited to an organic electroluminescence display device, but may be a display device having a self-luminous element, such as a quantum-dot light emitting diode (QLED), for each pixel.

Further, the substrate 10 may be provided with a protective layer (not shown) made of polyethylene, for example, on an area opposite to the circuit layer 16. For example, the protective layer may be adhered to an area that is in the first area A1 shown in FIG. 2 and opposite to the circuit layer 16 of the substrate 10. Further, another protective layer may be adhered to the substrate 10 in the second area A2 in an area that is not bent and opposite to the integrated circuit chip 66 and the flexible substrate 68. These protective layers are disposed so as not to overlap the area where the first protective layer 70 and the second protective layer 72 are disposed.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate that is formed of a plurality of layers stacked together, the plurality of layers including a first organic insulation layer, a first inorganic insulation layer on the first organic insulation layer, a second organic insulation layer on the first inorganic insulation layer, and a second inorganic insulation layer on the second organic insulation layer;
a circuit layer that is stacked on the second inorganic insulation layer so as to include electrodes of a plurality of unit pixels forming an image, the circuit layer including a semiconductor layer in contact with the second inorganic insulation layer;
an integrated circuit chip;
a first protective layer; and
a sealing layer that covers and seals the circuit layer, wherein
the circuit layer includes a display element area in which a plurality of pixel electrodes corresponding to the plurality of unit pixels and a self-luminous element layer are provided, and a peripheral area that has a wiring connected between the display element area and a terminal and is partially bent,
the substrate includes a first area that overlaps the display element area of the circuit layer and a second area that overlaps the peripheral area and is partially bent,
the integrated circuit chip is connected to the terminal,
the first protective layer covers a top of the wiring partially bent in the peripheral area,
the second organic insulation layer is adhered to the first organic insulation layer via the first inorganic insulation layer in the first area, and
there is a predetermined area where the second organic insulation layer is not adhered to the first organic insulation layer via the first inorganic insulation layer in the second area.

2. The display device according to claim 1, wherein the first inorganic insulation layer and the second inorganic insulation layer are in contact with each other in the second area so that the second inorganic insulation layer covers a side portion of the second organic insulation layer.

3. The display device according to claim 1, further comprising: a flexible substrate electrically connected to the integrated circuit chip and arranged in the second area.

* * * * *